Aug. 3, 1971 G. KÖHL ET AL 3,597,289

METHOD OF ETCHING A SEMICONDUCTOR BODY

Filed Jan. 19, 1967

Inventors:
Günter Köhl
Werner Heidrich
By: Spencer & Kaye
Attorneys

United States Patent Office 3,597,289

Patented Aug. 3, 1971

3,597,289
METHOD OF ETCHING A SEMICONDUCTOR BODY

Günter Köhl, Konigstein, Taunus, and Werner Heidrich, Frankfurt am Main, Sossenheim, Germany, assignors to Licentia Patent-Verwaltungs G.m.b.H., Frankfurt am Main, Germany Filed Jan. 19, 1967, Ser. No. 610,375
Int. Cl. H01l *7/50;* C23f *17/00*
U.S. Cl. 156—17 7 Claims

ABSTRACT OF THE DISCLOSURE

A semiconductor body is etched by applying a continuous stream of etching fluid, a continuous stream of rinsing fluid, and a continuous stream of gas to the semiconductor body from three spaced nozzles while the semiconductor body is repeatedly moved past the nozzles.

BACKGROUND OF THE INVENTION

In the manufacture of semiconductor devices, the etching process represents an important process step which has many applications. For example, zones of a semiconductor body which have been distrubed by lapping are cleaned by a suitable etching solution. Furthermore, semiconductor structural elements must be subjected to an etching process for purposes of attaining favorable electrical properties after one or more PN junctions have been formed which terminate on the surface of the semiconductor material. In semiconductor structural elements with PN junctions that receive a reverse voltage, such as rectifiers and controllable rectifiers, a suitable shaping of the semiconductor surface is necessary in order to reduce the surface breakdown. If this shaping is achieved by mechanical means, the surface areas which have been treated in this manner must subsequently be etched.

In the prior art etching process, the entire semiconductor body, or the semiconductor structural element, is immersed into a suitable chemical etching solution, and the acid residues are removed by a rinsing agent when the etching process has been completed. It may be necessary to cover those surface areas of the structural semiconductor element which are not intended to be etched. It is also known to etch a semiconductor body electrochemically, in which case the etching agent may be directed from a nozzle onto the region to be etched. The disadvantage of this process is that the semiconductor body must be provided with suitable electrodes, and that a blocking PN junction must not be present between the electrode and the place or point to be etched.

SUMMARY OF THE INVENTION

The object of this invention is to provide a process for etching a semiconductor body, particularly for purposes of the shaping, at predetermined portions without requiring a cover to protect the remaining areas of the surface against undesired etching.

In accordance with the present invention, this object is obtained by directing continuous streams of etching fluid, rinsing fluid, and a gas successively and repeatedly against the region of the semiconductor body to be etched. During this process, the semiconductor body is preferably moved relative to the streams of etching fluid, rinsing fluid, and gas. In the preferred embodiment of the invention, the semiconductor body is rotated with respect to the nozzles which direct these fluids against the region to be etched.

DESCRIPTION OF THE PREFERRED EMBODIMENTS

Figure 1:
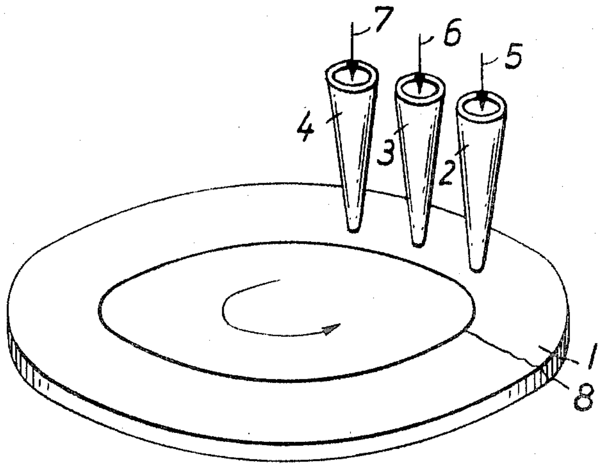
FIG. 1 is a perspective view of apparatus for etching a semiconductor body in accordance with the method of this invention.

FIG. 1 is a schematic illustration of one illustrative apparatus for etching semiconductors according to the present invention. The semiconductor body 1 executes a rotary movement in the direction of rotation indicated by the arrow. The rotational drive has not been shown in the figure. The semiconductor body may be positioned, for example, in a jig made of plastic material. Reference numeral 8 identifies the area of the semiconductor body which is to be etched. An etching fluid 5, a rinsing fluid 6, and a gas 7 emerge from respective stationary spaced nozzles 2, 3 and 4.

In the direction of rotation as indicated, a surface element of the area to be etched is exposed successively to the etching fluid, the rinsing fluid and the gas jet. According to the process of this invention, each surface element is exposed to the etching fluid for a period of time depending upon the speed of rotation, and the etching fluid is subsequently diluted by means of the rinsing fluid, which is removed by the gas jet. In this manner, the etching process takes place in a reproducible manner only in a predetermined area of the semiconductor body.

Any suitable etching fluid can be used in this invention e.g., a mixture of a strongly oxidized acid with hydrohalic acid. De-ionized water is suitable for use as a rinsing agent.

The etching solution given below has been found particularly useful for etching semiconductor bodies from silicon:

2 parts of $HNO_3$ by volume
1 part of 40% HF in $H_2O$ by volume
1 part of glacial acetic acid by volume
2 grams $NaNO_2$ per liter of acid mixture.

The high content of free $NO_2$ in the above-mentioned solution largely cancels the surface passivity of the silicon, so that the etching action begins without delay.

Figure 2:
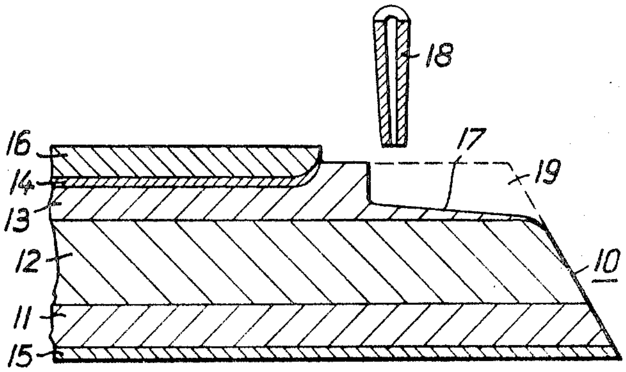
FIG. 2 is an enlarged horizontal cross-sectional view of a semiconductor device etched in accordance with the method of this invention.

The process of this invention may be employed in semiconductor bodies or semiconductor structural elements both for purification etching and for shaping. The method of this invention is particularly useful for shaping the marginal area of a controllable semiconductor rectifier in which the PN junctions which receive a reverse voltage are adjacent to the surface. As is well known, such shaping is necessary in order to reduce the surface field intensity. For purposes of explanation, a partial section of the edge of a large, axially symmetrical controllable semiconductor rectifier is illustrated in FIG. 2. The semiconductor body 10 contains four successive regions 11, 12, 13, and 14 having alternately opposite types of conductivity. Contacts 15 and 16 are joined to regions 11 and 14 respectively. The control contact has not been shown for purposes of greater clarity. Only one nozzle 18 has been shown in FIG. 2, but it will be understood that two other nozzles are provided in practice as shown in FIG. 1.

The region 19 to be etched off has been indicated by a dashed line in FIG. 2. By employing the process of this invention, the contour illustrated in the surface area 17 can be obtained. A path velocity of 10 m./min. is particularly favorable for this etching operation.

A controllable rectifier element etched according to the above described process has, for a base resistance of about 240 Ω/cm. (n-conductive), breakdown voltages about 4000 v. in both directions, whereas an element treated according the conventional processes has this breakdown voltage only in the negative voltage direction.

It will be understood that the above description of the present invention is susceptible to various modifications changes, and adaptations, and the same are intended to be comprehended within the meaning and range of equivalents of the appended claims.

What is claimed is:

1. A method of etching a semiconductor body comprising the steps of:

(A) directing a continuous stream of etching liquid against only a predetermined portion of a face of said semiconductor body for etching only said predetermined portion thereof, said predetermined portion constituting an area which is substantially less than the entire area of said face;

(B) then, directing continuous stream of rinsing liquid against said predetermined portion of said semiconductor body for diluting said etching fluid to terminate the etching action thereof;

(C) then directing a continuous stream of gas against said predetermined portion of said semiconductor body to remove the diluted etching fluid therefrom; and, (D) continuously repeating steps A, B, and C in succession until the desired etching of said predetermined portion of said semiconductor body has been attained.

2. The method defined in claim 1, wherein the semiconductor body is continuously moved relative to the streams of etching liquid, rinsing liquid, and gas.

3. The method defined in claim 2, wherein the semiconductor body is rotated relative to the streams of etching liquid, rinsing liquid, and gas.

4. The method defined in claim 1, wherein the streams of etching liquid, rinsing liquid, and gas are directed to the semiconductor body by nozzles.

5. The method defined in claim 1, wherein said etching liquid comprises a mixture of a strongly oxidized acid and hydrohalic acid.

6. The method defined in claim 1, wherein said etching fluid contains free $NO_2$.

7. A method of etching a predetermined portion of a face of a semiconductor body which portion is substantially less than the entire area of said face comprising the steps of:

(A) providing three continuous jet streams of fluid, the first of said streams being an etching liquid, the second of said streams being a rinsing liquid for diluting said etching liquid, and the third of said streams being a gas;

(B) continuously moving the semiconductor body relative to said three streams to successively direct said three fluid streams against said predetermined portion of the semiconductor body so that the said first stream causes etching of said predetermined portion of the semiconductor body, said second stream dilutes the etching liquid and terminates the etching action, and the third stream removes the diluted etching liquid from said predetermined portion of said face of the semiconductor body;

(C) repeatedly and successively subjecting said predetermined portion of the face of said semiconductor body to said three streams until the desired degree of etching of said predetermined portion of the semiconductor body has been attained.

References Cited

UNITED STATES PATENTS

| | | | |
|---|---|---|---|
| 3,012,921 | 12/1961 | Vaughn | 156—17 |
| 2,705,192 | 3/1955 | Faust et al. | 252—79.3 |
| 2,983,591 | 5/1961 | Stead | 252—79.3 |
| 3,342,652 | 9/1967 | Reisman et al. | 156—17 |
| 3,436,286 | 4/1969 | Lange | 156—17 |
| 3,437,543 | 4/1969 | Winings | 156—17 |

OTHER REFERENCES

| | | | |
|---|---|---|---|
| 253,432 | 8/1963 | Australia | 156—17 |
| 1,152,293 | 8/1963 | Germany | 156—17 |

JACOB H. STEINBERG, Primary Examiner

U.S. Cl. X.R.

156—345